United States Patent [19]
Bleker et al.

[11] Patent Number: 5,459,590
[45] Date of Patent: Oct. 17, 1995

[54] METHOD AND APPARATUS FOR FREELY SELECTABLE SUBSTITUTION OF THE ACHROMATIC PART IN MULTI COLOR PRINTING WITH THE BLACK INK

[75] Inventors: Sebastian Bleker, Kiel; Joern Kowalewski, Preetz, both of Germany

[73] Assignee: Linotype-Hell AG, Kiel, Germany

[21] Appl. No.: 224,161

[22] Filed: Apr. 7, 1994

[30] Foreign Application Priority Data

Apr. 8, 1993 [DE] Germany .......................... 43 11 610.8
Mar. 25, 1994 [DE] Germany .......................... 44 10 228.3

[51] Int. Cl.⁶ ............................... H04N 1/56; H04N 1/60
[52] U.S. Cl. ........................ 358/518; 358/520; 358/529
[58] Field of Search ................................. 358/518, 519, 358/520, 521, 523, 529, 530, 501, 504; 365/526

[56] References Cited

U.S. PATENT DOCUMENTS

| | | | |
|---|---|---|---|
| 4,908,712 | 3/1990 | Uchiyama et al. | 358/529 |
| 5,084,762 | 1/1992 | Miyakawa | 358/529 |
| 5,245,419 | 9/1993 | Gu | 358/521 |
| 5,255,084 | 10/1993 | Morikawa et al. | 358/527 |

*Primary Examiner*—Scott A. Rogers
*Attorney, Agent, or Firm*—Hill, Steadman & Simpson

[57] ABSTRACT

A method for freely selectable substitution of the achromatic part in multi-color printing with the black ink on the basis of a spectrally photometrically scanned original, whereby supporting points in the color space are acquired in the spectrally photometric scanning of the original. Corresponding to a preselected degree, the achromatic part or the complementary color part of the colors of a printing color space constructed multi-color are replaced by the black ink. Supporting point data are photometrically acquired from a color scale specifically associated to a printing process. The printing color space is classified into a color model that is independent of a printing color (HSL Model, FIG. 1) and is displayed in this model. A two-dimensional, non-linear deepening field is formed with luminance values (FIG. 2) and a two-dimensional, non-linear desaturation field is formed with saturation values (FIG. 3) that are taken from the original and the substitution of the achromatic part with the black ink is undertaken by an iterative search within the deepening field and within the desaturation field.

4 Claims, 4 Drawing Sheets

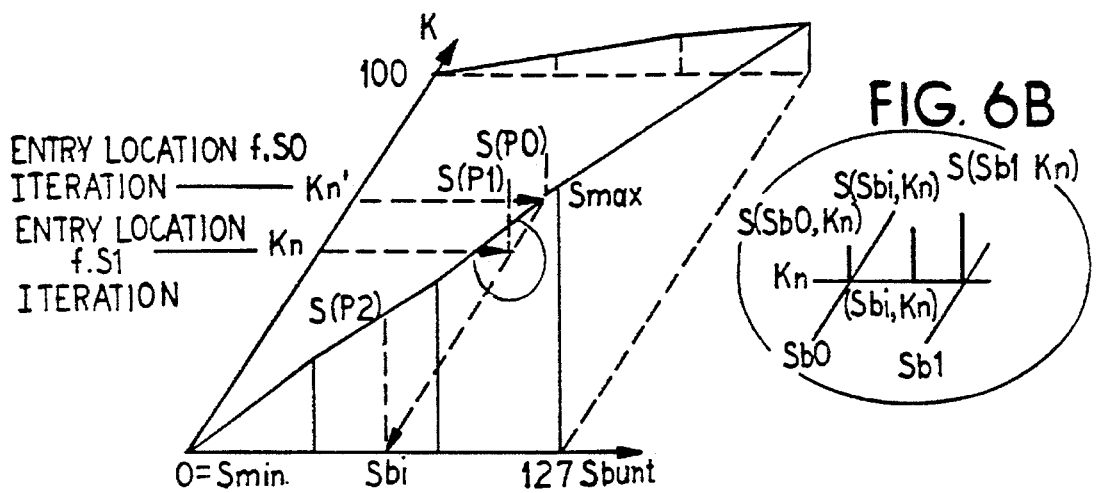
FIG. 6A
FIG. 6B
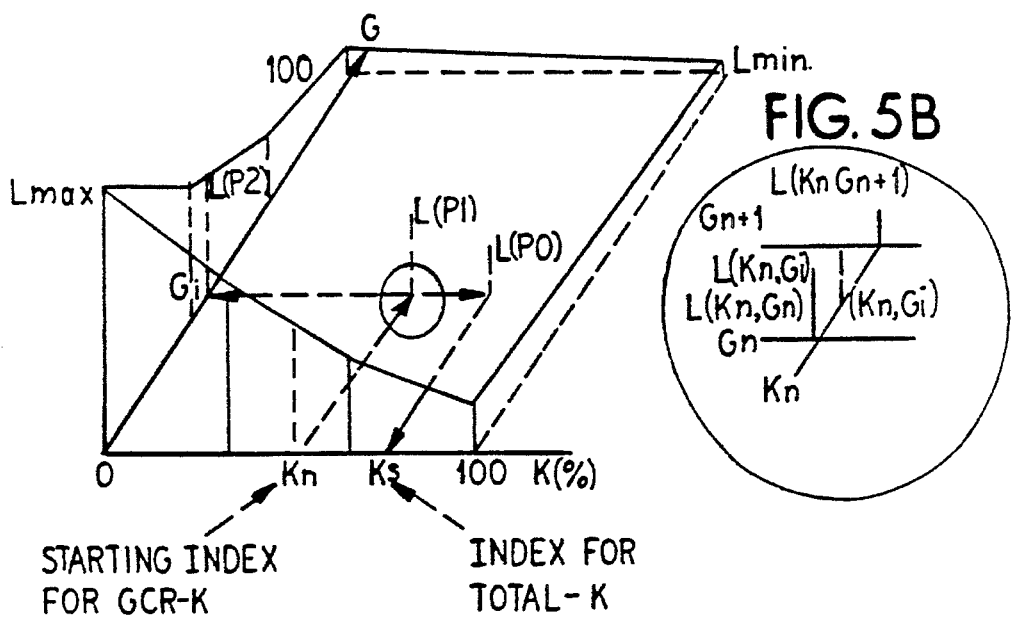
FIG. 5A
FIG. 5B

METHOD AND APPARATUS FOR FREELY SELECTABLE SUBSTITUTION OF THE ACHROMATIC PART IN MULTI COLOR PRINTING WITH THE BLACK INK

BACKGROUND OF THE INVENTION

The invention is directed to a method and to an apparatus for freely selectable substitution of the achromatic part in multi color printing with the black ink on the basis of an original that is previously spectrally photometrically scanned. Supporting valves are also supplied in the spectral photometric scanning.

SUMMARY OF THE INVENTION

An object of the invention is a freely selectable substitution of the achromatic part in the multi color print by the black ink.

According to the method and apparatus of the invention, a freely selectable substitution of the achromatic part in multi color printing with a black ink is provided on the basis of a spectrally photometrically scanned original. Supporting points in a color space are acquired in the spectrally photometric scanning of the original. Corresponding to a preselected degree, the achromatic part or the complimentary color part of the colors of a printing color space constructed in multi color fashion are replaced by the black ink. Supporting point data are photometrically acquired from a color scale specifically associated to a printing process. The printing color space is classified to a color model that is independent of printing color, and is displayed in this model. A two-dimensional, non-linear deepening field is formed with luminance values. A two-dimensional non-linear desaturation field is formed with saturation values taken from the original. The substitution of the achromatic part by the black ink is undertaken by an iterative search within the deepening field and within the desaturation field.

BRIEF DESCRIPTION OF THE DRAWINGS

FIG. 5 is an example of a deepening field for GCR;

FIG. 6 is an example of a desaturation field for GCR;

DESCRIPTION OF THE PREFERRED EMBODIMENTS

Figure 1:
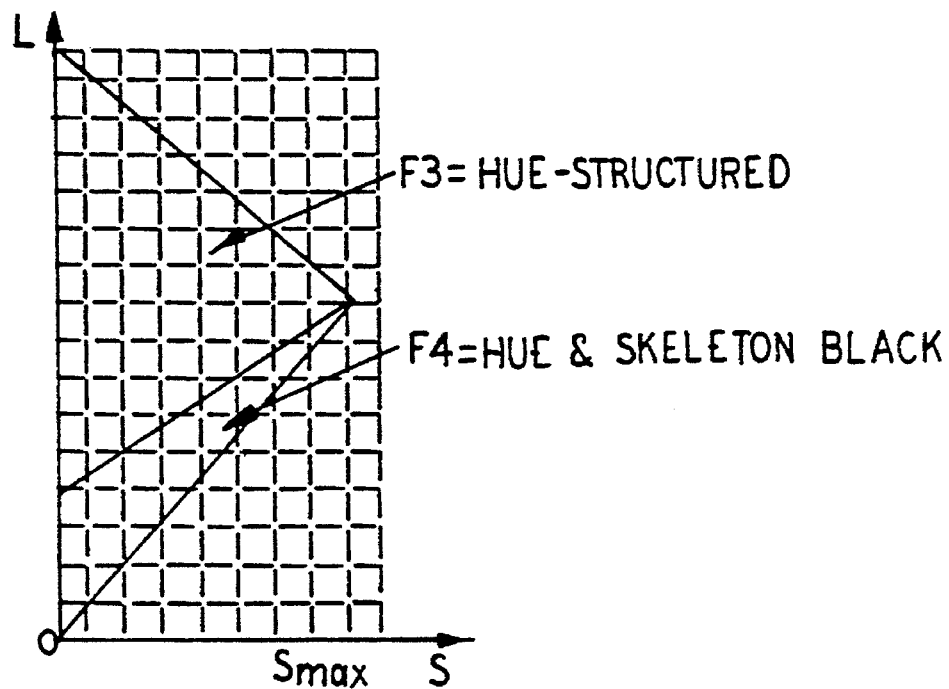
FIG. 1 shows a color shade with illustration of the color structuring.

Prerequisites for the implementation of the method which replaces the achromatic part or, respectively, complementary color part of all colors of the printing color space constructed in multi color fashion with the black ink according to the preselected and set degree are:

a photometric acquisition of suitable supporting data from a color scale specifically associated to the printing processes, a classification and presentation of the printing color space in a print-independent color model (HSL Model in this case—see FIG. 1), a two-dimensional, non-linear deepening field with luminance values (see FIG. 2), and a two-dimensional non-linear desaturation field with saturation values (see FIG. 3) that are likewise acquired from the scanned original.

Further approximately valid are:

The influence of black on the color shade (color shade shift) is negligible. The deepening with black is saturation-independent:

$\Delta L = f(K, L)$ (two-dimensional deepening field).

The desaturation with black is independent of the luminance, i.e.:

$\Delta S = f(K, S)$ (two-dimensional desaturation field).

The method includes calculating a skeleton black for the purpose of assisting the drawing and the contrast (depth expansion). Up to the setting of the GCR (Gray Component Replacement) degree (0 . . . 100%) and of the minimally printable black value (run-out value), the method works fully automatically and thereby extends over the entire printing space that can be realized in multi-color.

The pressure-independent color model HSL, in which calculation is exclusively carried out, follows from the LAB Model defined by the "Internationalen Beleuchtungskommission (CIE)" and is described in DIN Standard No. 6174. The rectangular (cartesian) Lab coordinate system is thereby transformed as follows into the cylindrical HSL coordinate system"

$$L = 116(\sqrt[3]{Y/Yo} - 16) \qquad ;[0 \ldots 100]$$

$$a = 500(\sqrt[3]{X/Xo} - \sqrt[3]{Y/Yo})$$

$$b = 200(\sqrt[3]{Y/Yo} - \sqrt[3]{Z/Zo})$$

$$H = \arctan(b/a) \qquad ;[0 \ldots 2\pi]$$

$$S = \sqrt{a^2 + b^2} \qquad ;[0 \ldots S_{max} \text{ print}]$$

The HSL Model is equidistantly quantized in all three axes on 128 steps (arbitrarily expandable) and is correspondingly standardized to $2*\pi$ for H to 100 L and to the maximally occurring modulation (usually less than 100) for S by the printing process. The inventive spacing in the useful range thereby amounts to less than $1\Delta E$ in the grid erected in hue (H) saturation (S) and luminance (L) and thereby lies below the threshold that can be perceived with the human eye. As a consequence of the influence of black which is independent of hue, the GCR process is respectively applied only to one hue at one point in time (grid S, L with 128*128 points). The degrees of freedom for CMY are thereby substantially reduced. The description of the GCR process can therefore occur in one hue as being representative for all other hues. German Patent Application No. P 40 12 905.5, filed Apr. 23, 1990, corresponding to U.S. Ser. No. 07/940,894, filed Oct. 23, 1992 is referenced for the transformation of the trichromatic printing color space. This method for substituting the achromatic part of a color (F3 in FIG. 1) constructed chromatically in a selectable range 0% . . . 100% initially expands the trichromatic space (F3) by the four-color space (F4) that reproduces the entire scope of the printing process together with F3. In a second step, the requested GCR degree is calculated over the entire printing space (F3+F4). In the first step, the four-color space is generated to such an extent that the trichromatic CMY marginal triad and the black value with which the color of the point can be realized is known for every grid point (LS)

of F4. By mixing in black to the lower, trichromatic margin, the four-color margin is calculated. All colors between the trichromatic lower margin and the four-color lower margin can thus be mixed from the trichromatic marginal colors and a specific black value. It is important for the actual GCR process in this step to assure the L, S coordinates of the chromatic marginal color triad, since the GCR process works with luminance values and saturation values and not with print-independent CMYK values.

After the scope has been identified in the first step, the GCR process starts in the lowest point of the hue with the lowest saturation level. Over the further course, the entire hue is processed in that, first, the saturation index is incremented up to maximum saturation given a constant luminance index and, subsequently, the luminance index is incremented given simultaneous incrementation of the saturation index to the first level. Corresponding to the previously noted L, S coordinates, what trichromatic marginal color was employed for structuring can then be identified for the four-color region. The black value (short black value) calculated first is unimportant to the effect that the GCR process calculates a new black value that implicitly contains the first black value for the F4 region (non-additively). The algorithm calculates the black value (GCR-K) required for the GCR process from the minimum CMY value and from the GCR degree . . . 100% that has been set. An iterative approximation method subsequently calculates a point in F3 with the assistance of the two-dimensional deepening fields and desaturation fields that, printed superimposed with the required GCR-K, exactly rematches the trichromatic color. As a consequence of the deepening and desaturating properties of the black ink, this point lies in greater luminance and saturation than the trichromatic marginal color. The GCR process has been ended here for the trichromatic region and the original, trichromatically structured color is replaced by the iterated, brighter and more saturated color in combination with the GCR-K. A stronger black value is calculated for the four-color domain with the non-linear deepening and desaturation fields, this black value rematching the original color F4 with the CMY triad of the bright and saturated substitute color. In cases wherein the maximum black value of 100% is exceeded or when the theoretical substitute color lies outside the printing space, a step-by-step reduction of the GCR-K occurs. The method thereby works up to the minimally printable value (threshold) for GCR-K. The minimally printable value (for example 2%) is set at the beginning.

Figure 4:
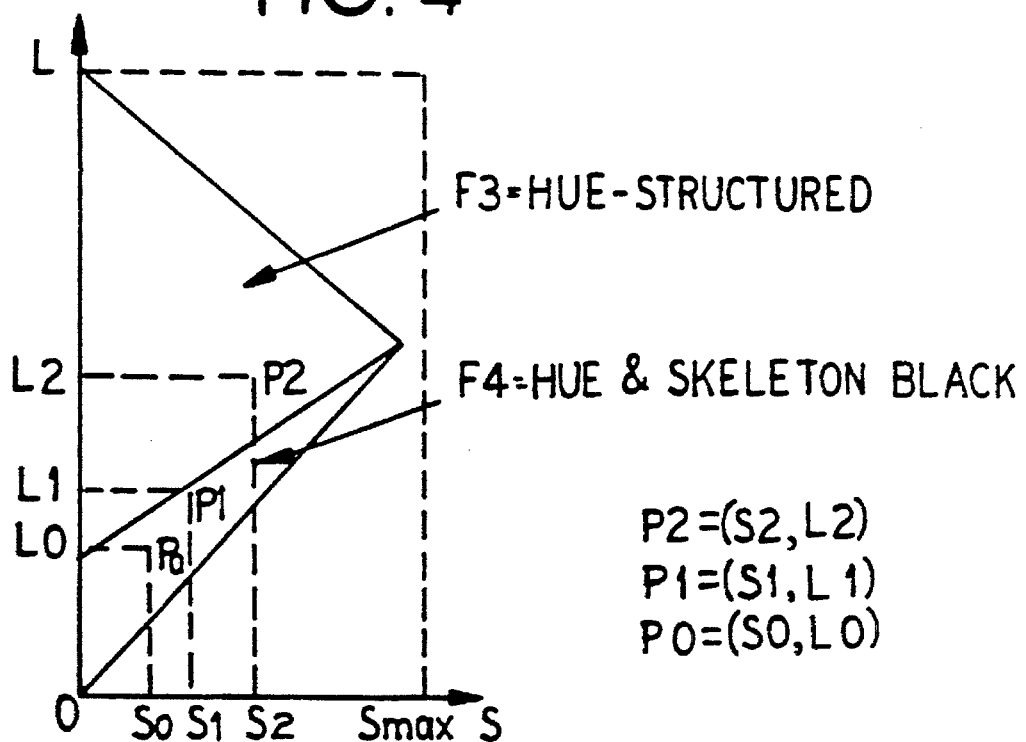
FIG. 4 shows a constant color shade for illustration of a GCR (Gray Component Replacement) generation.

An X-percent (X=[0 . . . 100%]) GCR is to be implemented in FIG. 4 for the point PO (SO, LO). The following is known about the point PO:

the luminance and the saturation, and the luminance and saturation of the trichromatic marginal color P1 (S1, L1), that rematches PO combined with a specific black value. The GCR-K required is calculated from the minimal printing color of the trichromatic reconstruction P1 and from the GCR degree that has been set GCR-K=GCR-degree*Min CMY(P1), GCR-degree:=X/100;

0<=GCR-degree<=1.0

O corresponds to hue structure including skeleton black 1.0 corresponds to 100% GCR The term "skeleton black" is well known to those skilled in this art and means the density function where the black printer prints primarily in the dark tones of the gray scale. This is explained in the Pocket Guide to Color Reproduction of Mr. Southworth, Copyright 1979 at page 12. An example of a skeleton black function is shown therein at page 43 for curve No. 3, where it can be seen that the black function increases at the darker tones of the scale. The concept of skeleton black is also shown in "Principles of Color Reproduction", 1967 of Mr. Yule and the discussion relating to FIG. 11.03 which shows a skeleton black function by the curve B where it can be seen that for darker values the skeleton black print increases. See also the Combi-Chromagraph Operating Manual, July, 1968 at page 14, pointing out that almost no under-color removal or no under-color removal at all results in a black separation which is lighter also in the middle tones, the so-called skeleton black. Finally, in U.S. Pat. No. 3,758,707 in FIG. 2, block 88 and the description at column 4, lines 30–48 also shows how the black skeleton function is calculated, namely by selecting the extreme values (maximum or minimum values) from the color values. In summary, the term "skeleton black" is known to those skilled in this art, particularly with respect to under-color removal (UCR) where the amount of black ink addition increases to the darker tones.

The deepening compensation is shown in FIG. 5. The required black value (GCR-K) specifies the starting point (Kn, G=O) for the iteration of L2. Given a constant K index (=Kn), a coordinate point for which $$L(Kn, Fi)=L(P1)$$

is valid is approximated by an iteration method with subsequent re-interpolation between the coordinates (Kn, Gn) and (Kn, Gn+1), whereby L (Kn, Gn)>L(P$_1$)>L(Kn, Gn+ 1). The normal onto the G axis then yields the luminance L(P2) in (0, Gi) that leads to L(PO) printed superimposed with GCR-K on L(P1) or, respectively, with K-total. Total K is found in that, proceeding from the point (Kn, Gi), a further point having Ks>Kn is iterated parallel to the K axis, $$L(Ks, Gi)=L(PO)$$

being valid for this further point. The normal onto the K-axis yields the total-K in a point (Ks, O) which, printed onto P2, deepens the luminance L(P2) to L(PO).

In instances wherein L(P1)>L(Kn, O), the GCR-K is automatically reduced step-by-step; in instances wherein L(P1)<L(Kn, 100), it is automatically incremented. The results of this deepening compensation are:

to deepen the luminance for P2 to deepen the K value by L(P2) to L(P1) or, respectively, L(PO).

The desaturation compensation is shown in FIG. 6.

The desaturation of the unknown point P2 is dependent on the saturation S(P2) and on the black value to be applied. In the case of the GCR in the trichromatic domain (F3), the black value is precisely GCR-K; and in the four-color domain (F4) it is the total-K.

The black value prescribes the starting point into the two-dimensional desaturation field for iteratively seeking the S(P2). The iteration method with following re-interpolation between the coordinates (SbO, Kn) and (Sb1, Kn), whereby (SbO, Kn)< S(P1)<(Sb1, Kn) approximates a coordinate point for which $$S(Sbi, Kn)=S(P1) \text{ [or, respectively, } S(Po)]$$

is valid, given a constant K-index (Kn). The S hue axis thereby identifies a gray scale axis that is exclusively constructed by the chromatic printing colors (CMY).

The normal onto the S hue axis supplies the saturation (S(P2)) which, when P2 is overprinted with GCR-K or total-k, yields the saturation S(P1), or S(P0), respectively.

The result of the desaturation compensation is the saturation S2 to be required in the point P2=(S2, L2).

Deepening compensation and desaturation compensation determines the luminance and saturation for the new point P2 (L2, S2). The required point P2 is now found very quickly by a two-dimensional gradient method in the monotonous hue grid. When this point is located within the trichromatic printing space, the printing values CMY(K) of the starting point for which the GCR was implemented are replaced by the chromatic printing value triad of P2 and the GCR-K or total-K. When P2 lies outside the trichromatic printing space, the GCR-K is deincremented step-by-step until the GCR process supplies a printable result or until the minimally printable black value is downwardly crossed for GCR-K. This results only at the lower four-color margin where 100% skeleton black is already added or results given highly saturated, bright colors of the hue (upper margin of the trichromatic printing domain F3) wherein, of course, the achromatic part is extremely slight or is entirely lacking. In instances of the F4 domain, the color is constructed only with skeleton black (=100%) and with the trichromatic marginal color; the color remains chromatically constructed in the highly saturated trichromatic domain.

Figure 2:
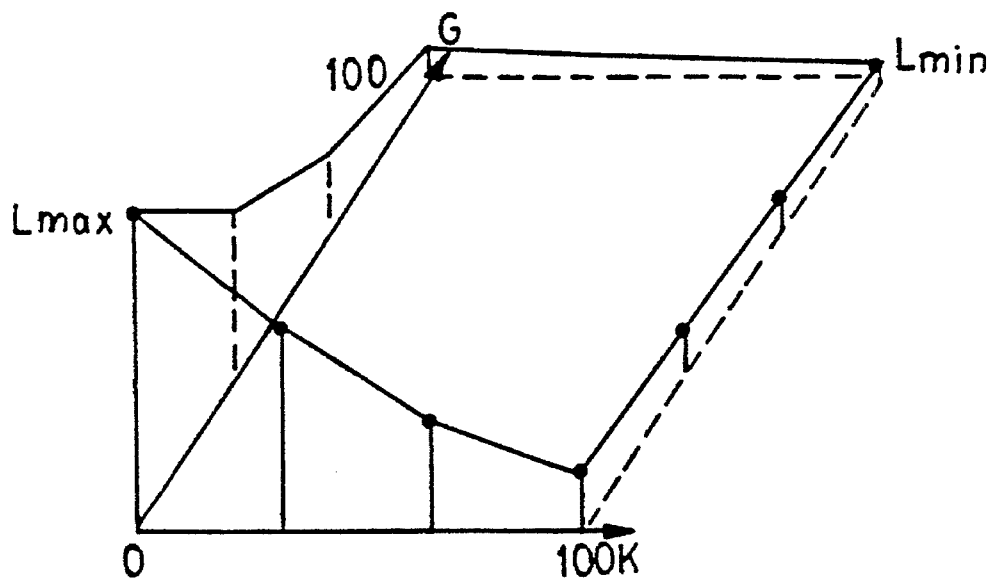
FIG. 2 is a schematic illustration of a deepening field.
Figure 3:
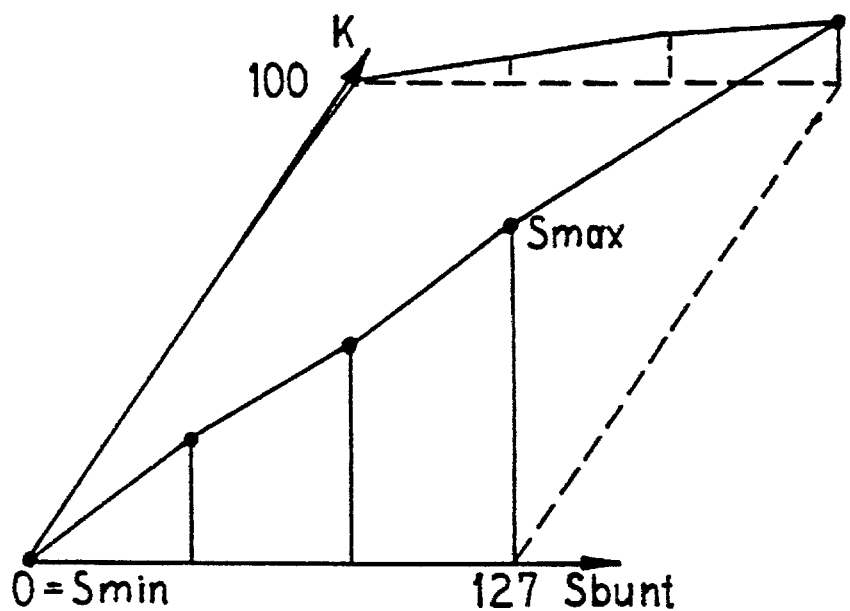
FIG. 3 is a schematic illustration of a desaturation field.
Figure 7:
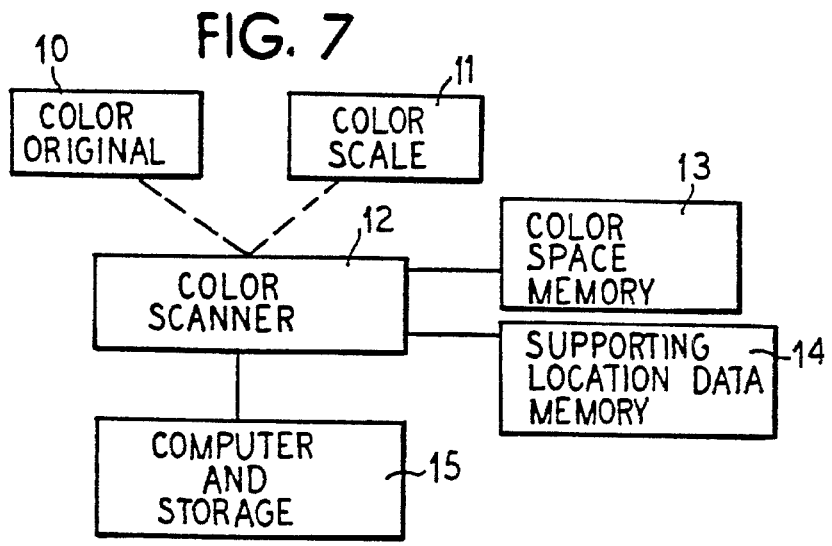
FIG. 7 is a block diagram illustrating equipment used in the method and apparatus of the invention.
Figure 8:
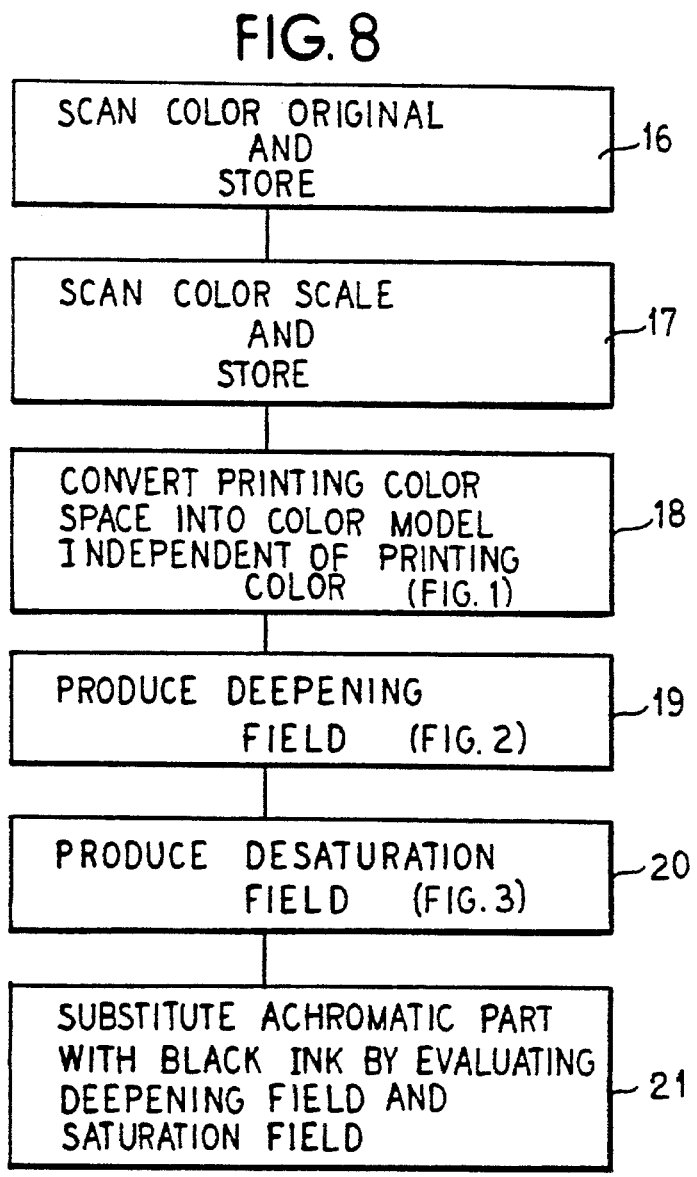
FIG. 8 is a flow chart of the functions performed by the equipment shown in FIG. 7.

The block diagram of FIG. 7 illustrates the equipment previously discussed in connection with the substitute of the achromatic part with black ink by evaluating the deepening field and the saturation field. As previously described, a color scanner 12 scans a color original 10 and also a color scale 11. The color scanner has a color space memory 13 for storing information obtained when scanning the color original, and a supporting location data memory 14 for storing data acquired when scanning the color scale 11. A computer having a storage 15 receives information from the color scanner 12, color space memory 13, and supporting location data memory 14 and performs the computations previously described, and more particularly the steps shown in FIG. 8 at 18 through 21 wherein the printing color space is converted into a color model independent of printing color as illustrated by FIG. 1; production of the deepening field as illustrated by FIG. 2; production of the desaturation field as illustrated by FIG. 3; and substitution of the achromatic part with black ink by evaluating the deepening field and the saturation field. FIG. 8 also illustrates in step 16 the step of scanning the color original and storing information related thereto as previously described, and the step illustrated at 17 of scanning the color scale and storing the information previously described.

Although various minor changes and modifications might be suggested by those skilled in the art, it will be understood that we wish to include within the scope of the patent warranted hereon, all such changes and modifications as reasonably come within our contribution to the art.

We claim as our invention:

1. A method for freely selectable substitution of an achromatic part in multi color printing with black ink based on a spectrally photometrically scanned original, supporting points and a color space being acquired in the spectrally photometric scanning of the original, comprising the steps of:

photometrically acquiring supporting point data from a color scale specifically associated to a printing process;

classifying the printing color space into a color model that is independent of printing color and is displayed in said color model;

forming a two-dimensional, non-linear deepening field with luminance values taken from the original;

forming a two-dimensional, non-linear desaturation field formed with saturation values taken from the original; and corresponding to a preselected gray, replacing by the black ink the achromatic part or a complementary color part of colors of the printing color space constructed in multi color fashion, and undertaking said substitution of the achromatic part by the black ink by an iterative search within said deepening field and within said desaturation field.

2. A method according to claim 1 including the step of implementing a re-interpolation after said iterative search.

3. A method according to claim 1 including the step of carrying out work with a skeleton black for assisting drawing and boosting of contrast.

4. An apparatus for freely selectable substitution of an achromatic part in multi color printing with a black ink, comprising:

means for spectral-photometric scanning of a color original, said means including a color space memory for storing supporting points and a color space acquired in the scanning of the original;

calculating and storage means for substituting colors of a printing color constructed in multi-color fashion by the black ink dependent on a preselected degree of the achromatic part or of a complementary part of colors of the printing color space constructed in multi-color fashion;

means for photometric scanning of a color scale specifically associated to a printing press, said means for photometric scanning being connected to a further memory for storing supporting location data acquired in scanning of a color scale specifically associated to said printing process;

means for converting the printing color space into a color model that is independent of a printing color;

means for producing a two-dimensional, non-linear deepening field with luminance values taken from the original;

means for producing a two-dimensional, non-linear desaturation field with saturation values taken from the original; and means for substituting the achromatic part with the black ink by evaluating said deepening field and said desaturation field.

* * * * *